United States Patent [19]

Koshimaru

[11] Patent Number: 5,254,865
[45] Date of Patent: Oct. 19, 1993

[54] SEMICONDUCTOR INTEGRATED CIRCUIT DEVICE EMPLOYING MOSFETS

[75] Inventor: Shigeru Koshimaru, Tokyo, Japan

[73] Assignee: NEC Corporation, Tokyo, Japan

[21] Appl. No.: 912,751

[22] Filed: Jul. 13, 1992

[30] Foreign Application Priority Data

Jul. 12, 1991 [JP] Japan ............................ 3-198383

[51] Int. Cl.[5] ...................... H01L 29/10; H01L 27/02
[52] U.S. Cl. ..................................... 257/344; 257/369
[58] Field of Search ............... 257/344, 369, 368, 337

[56] References Cited

U.S. PATENT DOCUMENTS 4,918,501  4/1990  Komori et al. ...................... 257/344
4,937,645  6/1990  Ootsuka et al. ..................... 257/369

FOREIGN PATENT DOCUMENTS 64-76768  3/1989  Japan.

OTHER PUBLICATIONS

Patent Abstracts of Japan, vol. 13, No. 298 (E-784) Mar. 22, 1989.

*Primary Examiner*—Mark V. Prenty
*Attorney, Agent, or Firm*—Sughrue, Mion, Zinn, Macpeak & Seas

[57] ABSTRACT

A MOSFET having a drain region consisting of a low concentration impurity diffused layer and a high concentration impurity diffused layer with shallow junction is employed. The variations of the device characteristics are averaged out and the life of the device as a whole is prolonged by increasing the length of the low concentration impurity diffused layer of an N-channel MOSFET, of a circuit whose operating conditions are susceptible to the hot electron effect as in the case of a CMOS address inverter which receives an address signal supplied as a TTL output, and by lowering the drain voltage by an advantageous use of the potential drop due to the resistance of the low concentration impurity diffused layer. The length of the low concentration impurity diffused layer of other MOSFETs is designed by considering the withstand voltage against punch-through between the drain and the source. In this way, it becomes possible to reduce the channel length compared with the case of a device with LDD structure.

4 Claims, 3 Drawing Sheets

SEMICONDUCTOR INTEGRATED CIRCUIT DEVICE EMPLOYING MOSFETS

BACKGROUND OF THE INVENTION

The present invention relates to a semiconductor integrated circuit device, and more particularly to a semiconductor integrated circuit device employing MOSFETs (MOS IC).

As the reduction of the MOSFET channel length is pursued and the intensity of the electric field between its source and the drain becomes high along with the advancement in the high density integration of the MOS IC, the reliability of the IC is reduced due to a hot carrier effect. The hot carrier effect which is especially conspicuous in an N-channel MOSFET is caused by the generation of the electron and hole pairs through collision of carriers (electrons in the N-channel MOSFET) which are accelerated by the electric field with silicon lattices in the vicinity of the drain edge, and the trapping of the electrons moving toward the gate electrode in the gate oxide film. The trapped electrons become the cause which brings about the shift of a threshold of the MOSFET, and a degradation of characteristics such as the reduction of the value of gm.

A MOSFET with lightly doped drain (LDD) structure in which the drain region is constituted of a high concentration impurity diffused layer and a low concentration impurity diffused layer added in a part nearer to the gate electrode, is in widespread use as being effective for relaxation of the hot carrier effect. Since, however, the withstand voltage against punch-through is determined by the distance between the high concentration impurity diffused layer of the drain region and the high concentration impurity diffused layer of the source region (usually it has a constitution similar to that of the drain region) even in the LDD structure, it is difficult to reduce the channel length to below 0.6 μm when the power supply voltage is 5 V.

Moreover, an extremum exists for the bias condition under which the hot electron effect is most likely to occur. For example, in a circuit with a power supply voltage of 5 V, the effect is most likely to occur when the gate voltage is about 2 to 2.5 V. However, among circuits equipped with a plurality of CMOS inverters there exist circuits whose input voltages remain in the aforementioned range of 2 to 2.5 V for a considerable length of time in the process of transition of the signal output due to the demands on the circuit. Examples of such a circuit include an input buffer which receives a signal that is given as a TTL output, for instance, an address inverter in a semiconductor memory. Accordingly, the reliability of such a semiconductor integrated circuit device is dominated by the properties of the N-channel MOSFET of the input buffer.

SUMMARY OF THE INVENTION

It is therefore an object of the invention to further enhance the reliability of a semiconductor integrated circuit device by averaging out the variations of the characteristics due to the hot electron effect.

It is another object of the invention to further promote the high density integration of a semiconductor integrated circuit device.

The semiconductor integrated circuit device according to this invention includes a plurality of MOSFETs that include a drain region consisting of a low concentration impurity diffused layer and a high concentration impurity diffused layer. The low concentration impurity diffused layer is extended in the lateral direction from the edge part directly below the gate electrode to be linked to the high concentration impurity diffused layer. The distance from the edge part directly below the gate electrode to the high concentration impurity diffused layer, that is, the length of the low concentration impurity diffused layer is determined corresponding to the operating conditions of the circuit. In a circuit which is liable to be subjected to variations in the characteristics due to the hot electrons, the length of the low concentration impurity diffused layer is increased and the voltage between the source and the drain is reduced. By so doing, the variations in the characteristics for a plurality of circuits which constitute the semiconductor integrated circuit can be averaged out, and the reliability of the device can further be enhanced. Moreover, the length of the low concentration impurity diffused layer can be set at a desired value above the lower limit that is determined by the accuracy of processing. Consequently, the withstand voltage against punch-through between the high concentration impurity diffused layer of the drain region and the source region can be raised to a sufficiently high value and the channel length can be diminished, making it possible to further promote the high density integration of the semiconductor integrated circuit device.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
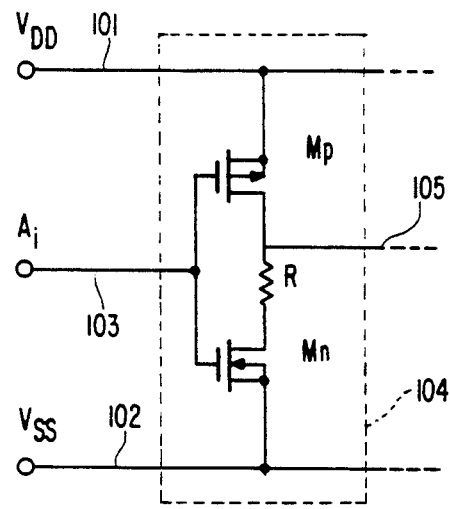
FIG. 1 is a circuit diagram for an address inverter for describing a first embodiment of the invention.

A first embodiment of this invention is a semiconductor memory whose peripheral circuit is constituted of CMOSs and has an address inverter 104 as shown in FIG. 1. The address inverter 104 consists of a P-channel MOSFET Mp and an N-channel MOSFET Mn. The reference symbol R represents the parasitic resistance of the drain region of the N-channel MOSFET Mn. The source region of the P-channel MOSFET Mp is connected to a power terminal to which is applied a power supply voltage $V_{DD}$ through a power supply wiring 101. The source region of the N-channel MOSFET Mn is connected to a grounding terminal to which is applied a grounding potential $V_{SS}$ through a grounding wiring 102. The gate electrodes of Mp and Mn are connected in common and the commonly connected line is connected to an address input terminal to which is applied an address signal Ai (i=0, 1, 2, ..., and n) through an address signal wiring 103. The drain regions of Mp and Mn are connected in common and the commonly connected line is connected to a next stage circuit such as an address latch which is not shown, through an address output wiring 105. The address signal Ai is supplied from the outside as a TTL output driven by a power supply voltage 5 V. Accordingly, the minimum value by specification of "H" level is 2.4 V, and the maximum value by specification of "L" level is 0.8 V. When the power supply voltage $V_{DD}$ in this embodiment is 5 V, the N-channel MOSFET Mn of those address inverters 104 that receive "H" level address signals is susceptible to variations of the characteristics due to hot electrons. However, the generation of the hot electrons can be relaxed because of the reduction of the drain voltage of Mn to below 5 V due to the presence of the parasitic resistance R in the drain region of Mn.

Figure 2:
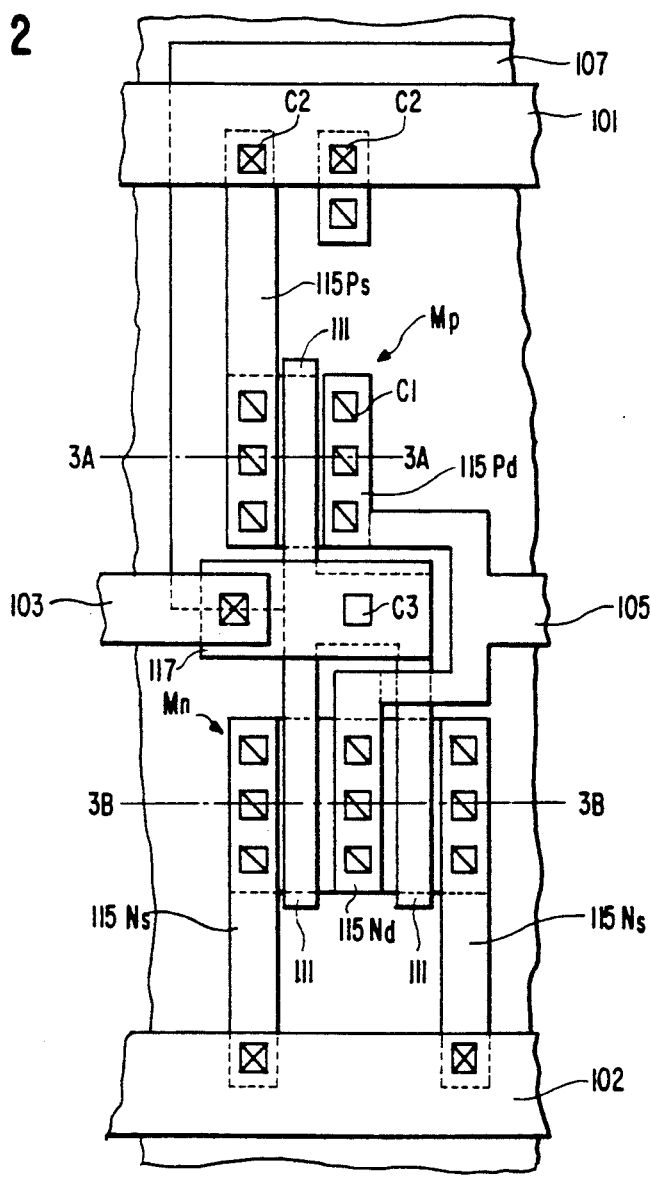
FIG. 2 is a plan view of a semiconductor chip for schematically showing the address inverter of the first embodiment.
Figure 3A:
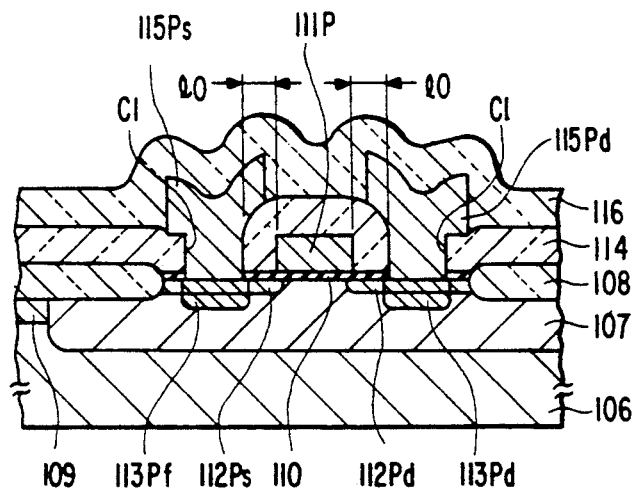
FIG. 3(a) is an enlarged sectional view taken along the line A—A in FIG. 2.
Figure 3B:
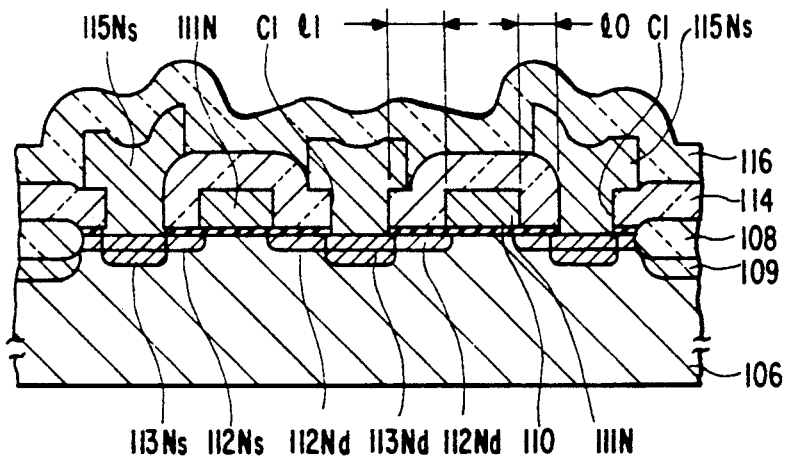
FIG. 3(b) is an enlarged sectional view taken along the line B—B in FIG. 2.
Figure 3C:
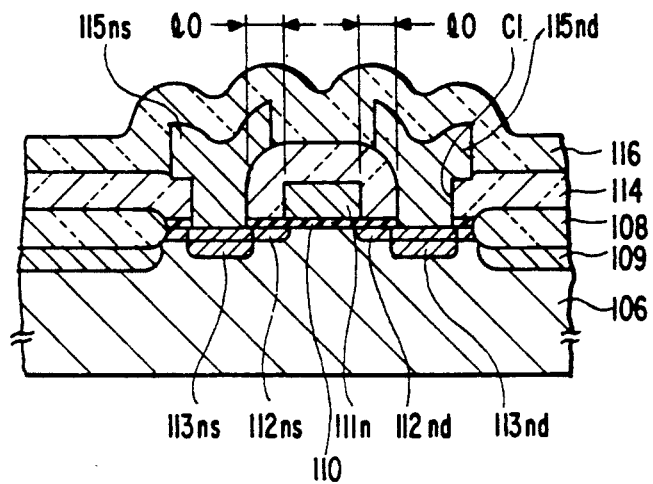
FIG. 3(c) is a sectional view of a semiconductor chip for schematically showing an N-channel MOSFET used in a circuit other than the address inverter in the first embodiment.

Next, referring to FIG. 2 and FIG. 3, the structure of the IC device will be described.

An N well 107 is formed selectively on the surface part of a P-type silicon substrate 106. Then, a gate oxide film 110 with thickness of 15 nm is formed in a transistor forming region subdivided by selectively formed field oxide film 108. The reference numeral 109 represents a channel stopper provided adjacent to the bottom part of the field oxide film 108 in the region other than the N well 107. Gate electrodes 111P, 111N, and 111n with gate length of about 1 μm consisting of a polycide film are formed traversing the transistor forming region via the gate oxide film 110. P⁻-type impurity diffused layers 112Pd and 112Ps, and N⁻-type impurity diffused layers 112Nd, 112Ns, 112nd, and 112ns are formed by selectively implanting boron ions and arsenic ions, respectively. These low concentration impurity diffused layers are formed in self alignment with the gate electrodes, with small junction depth not exceeding about 0.1 μm, impurity concentration of from about $1\times10^{13}$ cm⁻³ to about $1\times10^{14}$ cm⁻³, and sheet resistivity of about 2500 Ω/square.

Subsequently, an interlayer insulating film 114 is deposited and contact holes C1 (represented by squares with respective diagonals in FIG. 2) are formed. P⁺-type impurity diffused layers 113Pd and 113Ps, and N⁺-type impurity diffused layers 113Nd, 113Ns, 113nd, and 113ns are formed by selectively implanting boron difluoride ions and arsenic ions, respectively. Next, a first layer of an aluminum alloy film is formed and by patterning the film there are formed a drain wiring 115Pd and a source wiring 115Ps of the P-channel MOSFET and drain wirings 115Nd and 115nd and source wirings 115Ns and 115ns of the N-channel MOSFET.

The drain wiring 115Pd of the P-channel MOSFET Mp and the drain wiring 115Nd of the N-channel MOSFET Mn are combined into an address output wiring 105. The source wiring 115Ps of the P-channel MOSFET Mp is connected to the power supply wiring 101 consisting of a second layer of an aluminum alloy film via a through hole C2 (represented by a square with two diagonals in FIG. 2) provided in an interlayer insulating film 116. Similarly, the source wiring 115Ns of the N-channel MOSFET Mn is connected to the grounding wiring 102. The gate electrode is connected to the first layer of an aluminum alloy film 117 via a through hole C3 provided in the interlayer insulating film 114, and the first layer of an aluminum alloy film 117 is connected to the address signal wiring 103 via a through hole C2.

The threshold voltage of the P-channel MOSFET Mp of the address inverter is −0.6 V, its channel width is 4 μm, and its channel length is 0.8 μm while the threshold voltage of the N-channel MOSFET Mn is 0.6 V, its channel width is 26.5 μm, and its channel length is 0.7 μm. Although two cells are shown arranged in parallel as the N-channel MOSFET in FIG. 2, actually around seven cells are arranged in parallel. The threshold voltage and the channel length of the MOSFET used in a peripheral circuit other than the address inverter are designed to have the same values as in the above.

The length 0 of the low concentration diffused layer of the P-channel MOSFET and the N-channel MOSFET of the peripheral circuit or the like (strictly speaking, the distance from the edge of the high concentration diffused layer to the lower part of the gate electrode) is fixed by considering the withstand voltage against punch-through between the source and the drain and the margin in processing. In this embodiment it is designed to be 0.5 μm. That is, it is given a value greater than the size of 0.2 to 0.3 μm for the side wall of the gate electrode that is ordinarily used in a MOSFET with LDD structure. Accordingly, the withstand voltage against punch-through can be raised and the channel length can be reduced. Moreover, it is possible to further improve the high integration density of the semiconductor memory by adopting such MOSFETs for a peripheral circuit other than the address inverter and an internal circuit.

For the N-channel MOSFET Mn of the address inverter, the length l of the N⁻-type impurity diffused layer 112Nd of the drain is designed to be given a value of 0.75 to 1 μm or so. When l1 is chosen to have a value of 1 μm, the resistance of the N⁻-type impurity diffused layer 112Nd is about 94Ω. Therefore, a potential drop of 0.24 V is generated due to a through current of 2.5 mA in the address inverter, which reduces the drain voltage of the N-channel MOSFET Mn, and prolongs the degradation time based on the through current to a value which is about six times as large. It is to be noted that the degradation time is defined here as the time from the rise of the threshold voltage to the decrease of the drain current by 1%. Actually, however, the degradation time is further prolonged due to rise of the source voltage caused by the parasitic resistance in the source region.

Figure 4A:
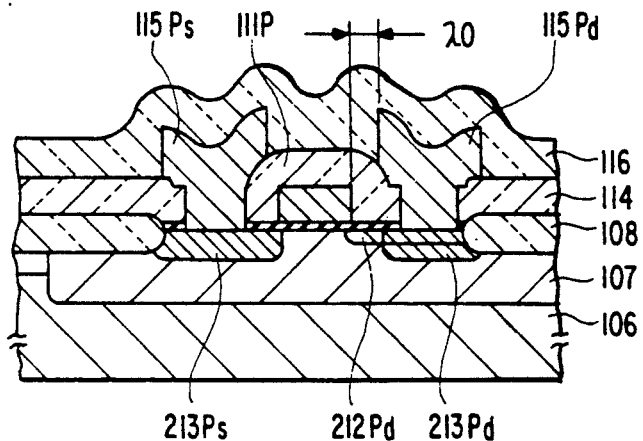
FIG. 4(a) is a sectional view of a semiconductor chip for schematically showing a P-channel MOSFET that constitutes an address inverter in a second embodiment of the invention.
Figure 4B:
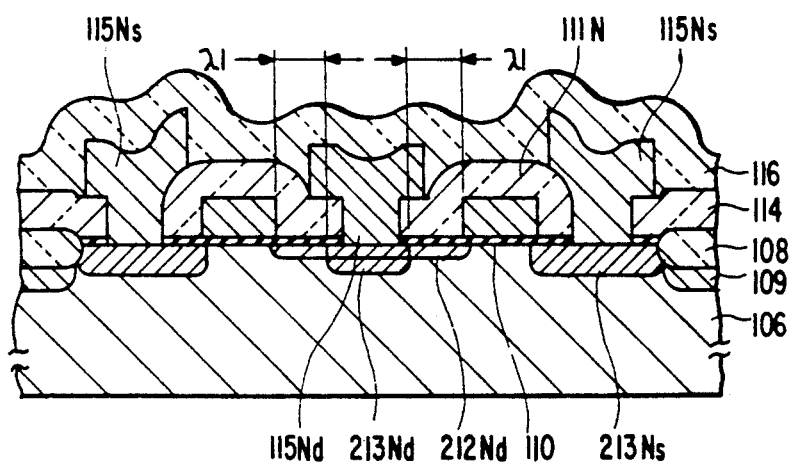
FIG. 4(b) is a sectional view of a semiconductor chip for schematically showing an N-channel MOSFET that constitutes the address inverter of the second embodiment.
Figure 4C:
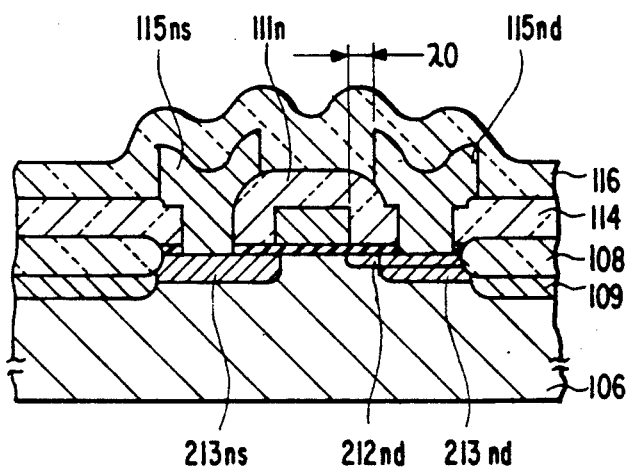
FIG. 4(c) is a sectional view of a semiconductor chip for schematically showing the N-channel MOSFET that constitutes a circuit other than the address inverter of the second embodiment.

Referring to FIG. 4, a second embodiment of the invention will be described.

In this embodiment, a P-channel MOSFET, an N-channel MOSFET of the address inverter, and the source region of the N-channel MOSFET for the peripheral circuit are constituted of a P⁺-type impurity diffused layer 213Ps, and N⁺-type impurity diffused layers 213Ns and 213ns that are in self-alignment with gate electrodes 111P, 111N, and 111n, respectively.

After the formation of a P⁻-type impurity diffused layer 212Pd and N⁻-type impurity diffused layers 212Nd and 212nd by means of ion implantation in accordance with the ordinary fabrication procedure of a CMOS, P⁺-type impurity diffused layers 213Ps and 213Pd, and N⁺-type impurity diffused layers 213Nd, 213Ns, 213nd, and 213ns are formed by the use of an appropriate mask such as a photoresist film. The above-mentioned mask is removed, an interlayer insulating film 114 is deposited to form contact holes, and a first layer of an aluminum alloy film is deposited. The subsequent processes are similar to those of the first embodiment.

The length λ0 of the low concentration impurity diffused layers of the P-channel MOSFET and the N-channel MOSFET of the peripheral circuit or the like needs only be determined by considering the withstand voltage against punch-through. The lower limit for the processing is given by the alignment accuracy of the mask for ion implantation at the time of formation of the high concentration impurity diffused layer. The length λ1 of the N⁻-type impurity diffused layer of the N-channel MOSFET of the address inverter is determined by considering the withstand voltage against punch-through and the resistance value. However, it is set to be given a value somewhat larger than l1 of the first embodiment.

Since a low concentration impurity diffused layer required in this embodiment is only for the drain region, it is possible to suppress the fluctuations of the characteristics to about one half of those of the first embodiment.

In the above, the invention has been described by taking the address inverter of a semiconductor memory as an example of the circuits which are susceptible to the variations of the device characteristics due to the hot electrons. It will be obvious to persons working in this field that the invention is equally applicable also to such a case of the input buffer of a MOS IC which is supplied with a signal from, for example, an A-D converter with TTL construction.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that appended claims will cover any modifications or embodiments as fall within the true scope of the invention.

What is claimed is:

1. A semiconductor integrated circuit device comprising:

a first circuit which includes a first N-channel MOSFET formed on a first region of a semiconductor substrate, said first N-channel MOSFET having a first gate electrode formed on said semiconductor substrate on a first gate insulating film covering a first channel region, a first source region and a first drain region, said first drain region including a first low concentration impurity diffused layer having an end portion defining said first channel region beneath said first gate electrode and a first high concentration impurity diffused layer formed in contact with said first low concentration impurity diffused layer at a first predetermined distance from said end portion of said low concentration impurity diffused layer; and a second circuit which includes a second N-channel MOSFET formed on a second region of said semiconductor substrate, said second N-channel MOSFET having a second gate electrode formed on said semiconductor substrate on a second gate insulating film covering a second channel region, a second source region and a second drain region, said second drain region including a second low concentration impurity diffused layer having an end portion defining said second channel region beneath said second gate electrode and a second high concentration impurity diffused layer formed in contact with said second low concentration impurity diffused layer at a second predetermined distance from said end portion of said second low concentration impurity diffused layer, wherein said second predetermined distance is greater than said first predetermined distance.

2. A semiconductor integrated circuit device as claimed in claim 1, wherein said second circuit is an input buffer which receives a signal given from the outside as a TTL output.

3. A semiconductor integrated circuit device as claimed in claim 2, wherein said input buffer is an inverter of CMOS structure.

4. A semiconductor integrated circuit device as claimed in claim 3, wherein said inverter is an address inverter of a semiconductor memory.

* * * * *